United States Patent [19]

Deiss

[11] Patent Number: 4,495,654
[45] Date of Patent: Jan. 22, 1985

[54] REMOTE CONTROLLED RECEIVER WITH PROVISIONS FOR AUTOMATICALLY PROGRAMMING A CHANNEL SKIP LIST

[75] Inventor: Michael S. Deiss, Indianapolis, Ind.
[73] Assignee: RCA Corporation, New York, N.Y.
[21] Appl. No.: 479,985
[22] Filed: Mar. 29, 1983
[51] Int. Cl.³ .......................... H04B 1/00; H04N 5/44
[52] U.S. Cl. .................................. 455/151; 455/166; 455/186; 455/353; 358/194.1
[58] Field of Search ............... 455/151, 166, 352, 353, 455/185, 186; 358/194.1

[56] References Cited

U.S. PATENT DOCUMENTS

| | | | |
|---|---|---|---|
| 4,114,104 | 9/1978 | Denzene et al. | |
| 4,318,130 | 3/1982 | Heuer | 455/186 |
| 4,322,855 | 3/1982 | Mogi et al. | |
| 4,355,415 | 10/1982 | George et al. | 455/166 |
| 4,361,907 | 11/1982 | Wine | 455/166 |

FOREIGN PATENT DOCUMENTS

| | | | |
|---|---|---|---|
| 2625131 | 12/1977 | Fed. Rep. of Germany | 358/194.1 |
| 2746552 | 4/1979 | Fed. Rep. of Germany | 455/151 |
| 2755596 | 6/1979 | Fed. Rep. of Germany | 358/194.1 |

OTHER PUBLICATIONS

"A Microprocessor System Which Drives Phase Locked Loop and Remote Control", by Kluger, Funkschav, vol. 52, #22, 10/24/80.
pp. 26, 30, 31 and 32 of the "RCA Television Service Data", File 1978, C-3, for the CTC 93 Series of Color Television Receivers.
p. 7 of the "ITT Semiconductor Summary 1980".

*Primary Examiner*—Jin F. Ng
*Attorney, Agent, or Firm*—Eugene M. Whitacre; Paul J. Rasmussen; Peter M. Emanuel

[57] ABSTRACT

A remote control system for a television receiver includes a remote control transmitter with keys for initiating a scan type channel selection operation and a memory for storing a list of preferred channels and non-preferred channels. During a scanning operation the non-preferred channels are passed over (i.e., "skipped"). The battery of the remote control transmitter advantageously also maintains the contents of the "skip" memory so that it may be volatile. So that the same type of channel selection is available locally at the television receiver itself scan keys and an associated skip memory are also incorporated with the chassis of the television receiver. Apparatus is provided to automatically program the local skip memory with the contents of the remote skip memory so that a user does not have to program both skip memories.

7 Claims, 16 Drawing Figures

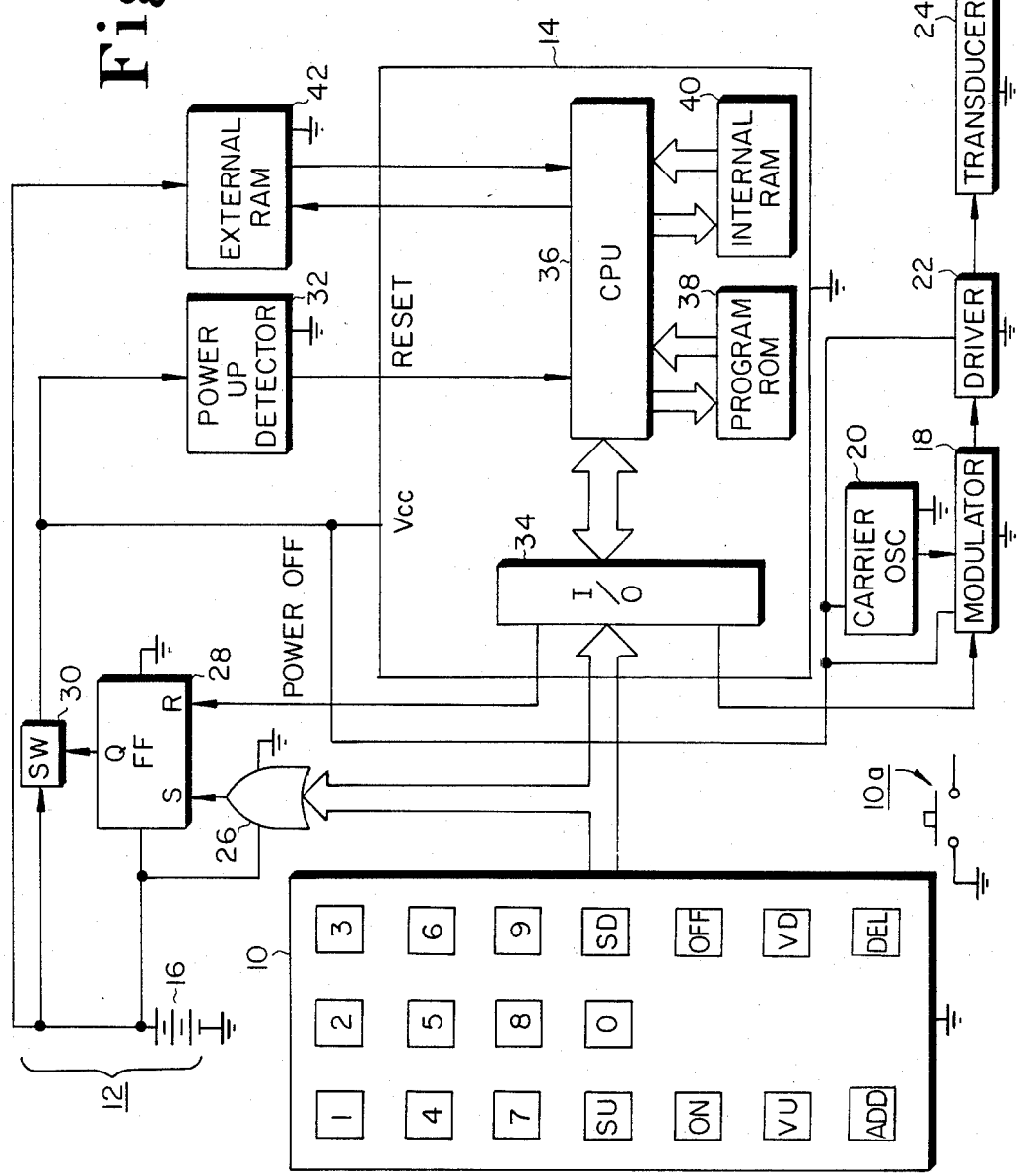

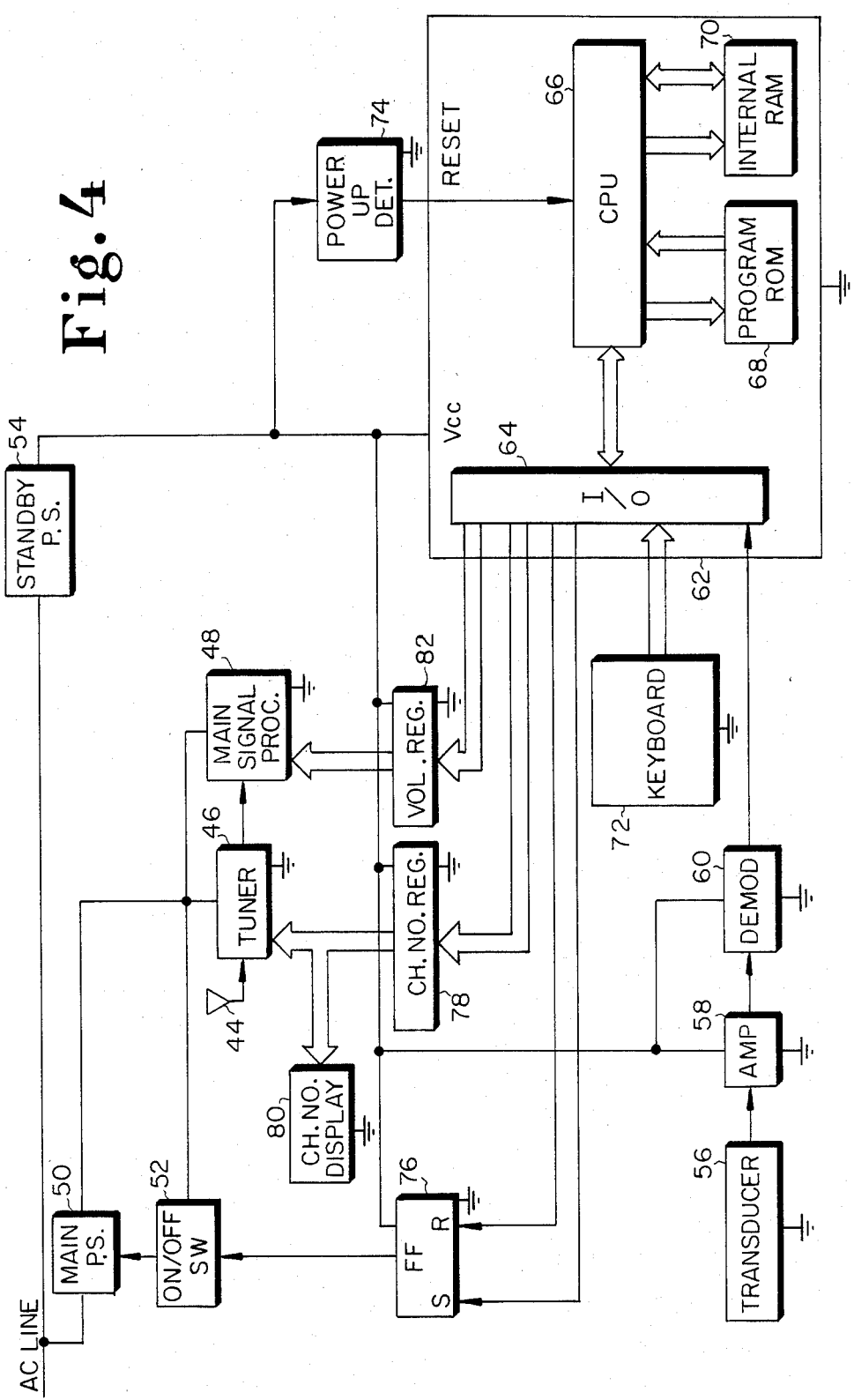

INTERNAL RAM 70

| | | |
|---|---|---|
| | SLL (82 X 1) | |
| CNL | CNLT(4) | CNLU(4) |
| | KEYL (4) | |
| CHL | CHLT(4) | CHLU(4) |
| | FNL (8) | |
| | DA (1) | |
| | SK (1) | |
| CHR | CHRT(4) | CHRU(4) |
| | FNR (8) | |
| | LAST (1) | |

Fig. 5

REMOTE CONTROLLED RECEIVER WITH PROVISIONS FOR AUTOMATICALLY PROGRAMMING A CHANNEL SKIP LIST

The present invention concerns a tuning apparatus for television and radio receivers which includes a memory for storing a list indicating preferred channels.

Tuning systems for television receivers sometimes include a memory, conventionally called a "skip memory", for storing a list indicating those channels which are preferred and those channels which are not preferred, i.e., those which are to be "skipped" over, in channel selection. When a user depresses a "scan up" or a "scan down" key memory locations of the skip memory corresponding to respective channels are sequentially addressed and then interrogated until a a memory location with an indication that the respective channel is preferred is located. At that point, the search stops and the channel corresponding to the presently addressed memory is tuned.

Since a conventional skip memory has to be programmed by a user, it is desirable that the skip memory be non-volatile or that the skip memory be continuously supplied with operating power from a standby power supply so that the skip memory does not have to be reprogrammed when the receiver is turned off. Nonvolatile memories tend to be expensive. A standby power supply may comprise a power supply continually connected to the AC line, i.e., not by way of the on-off switching apparatus of the receiver or a battery. However, an AC connected standby power cannot provide operating power to the skip memory during AC power failures or when the receiver is unplugged. The use of batteries in a television receiver itself presents the safety related problem of isolating users from the high voltages generated within the receiver.

To overcome the problems associated with reprogramming skip memories which are not non-volatile or provided with a battery power supply, it has been proposed to employ a signal seeking detector arrangement for automatically entering the preferred channel indication in memory locations of a skip memory whenever a received carriers has a predetermined characteristic, e.g., signal strength above a predetermined level. However, in such systems, the channels identified in the skip list may not coincide with those actually preferred by a user.

In accordance with an aspect of the present invention, a skip memory is included in the remote control transmitter of a remote control system for a television or radio receiver. In this manner the battery of the remote control transmitter serves to maintain the information contained in the skip memory. This enables the use of a relatively inexpensive volatile memory rather than a non-volatile memory. Since the battery for maintaining the information in the skip memory is in the remote control transmitter rather than in the television receiver itself, the aforementioned problems concerning safety are avoided.

Another skip memory is located in the the television receiver chassis so that a user may locally select channels at the television receiver itself in the same manner as with the remote control system. So that the local skip memory located in the television receiver does not have to be programmed by a user, apparatus is provided for automatically causing the local skip memory to be automatically programmed with or "learn" the skip list stored in the remote skip memory located in the remote control transmitter. Specifically, in a preferred embodiment of the present invention, when a channel identified as being preferred in the skip list of the remote control transmitter is selected after the depression of either a "scan up" or "scan down" key, the remote control transmitter transmits not only the channel number of the selected channel but also the selected direction of scan. The television receiver includes apparatus for sequentially addressing memory locations of the local skip memory from an address corresponding to an initial channel in the selected direction of scan in response to receipt of a remote control message indicating a channel selection by means of either the "scan up" or "scan down" key of the remote control transmitter. Data indicative of non-preferred channels, e.g., a logic "0", is entered into each addressed memory location of the local skip memory until the memory location corresponding to the transmitted channel number is reached. At that point, data indicative of a preferred channel, e.g., a logic "1", is entered into the presently addressed memory location of the local skip memory.

These and other features of the present invention will be described with reference to the accompanying Drawing in which:

FIG. 1 shows a schematic, in block diagram form, of a microprocessor controlled remote control transmitter constructed in accordance with an aspect of the present invention;

FIG. 4 shows a schematic, in block diagram form, of a television receiver including a microprocessor controlled remote control receiver constructed in accordance with an aspect of the present invention;

FIG. 5 illustrates the memory allocations for and the formats of data processed by the microprocessor of the remote control receiver shown in FIG. 4.

Figure 2A:
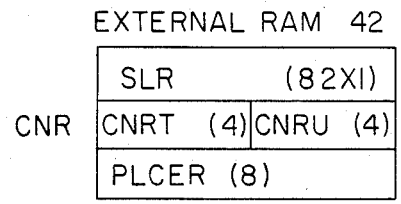
FIGS. 2a, 2b and 2c illustrate the memory allocations for and formats of data processed by the microprocessor of the remote control transmitter shown in FIG. 1.
Figure 2B:
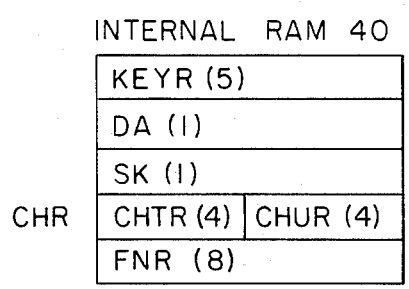

The remote control transmitter shown in FIG. 1 includes a keyboard 10 by which a user enters commands for selecting channels and controlling various other functions of the television receiver shown in FIG. 4. Keyboard 10 includes a plurality of normally opened pushbutton switches. A representative switch is shown at 10a. When a key of pushbutton switch is depressed, the switch is closed and a low logic level or logic "0" (ground potential) is developed at a respective output conductor. When the key is released, the switch automatically returns to the opened position and the logic "0" is removed from the respective output conductor.

Digit keys (0–9) of keyboard 10 allow channels to be directly selected by depressing the tens and units digits of the corresponding channel number in sequence. SU (Scan Up) and SD (Scan Down) keys allow the next higher or lower channel in a list of preferred channels (after the presently selected channel) to be selected. The ADD and DEL keys allow the addition or deletion of channels from the list of preferred channels. VU and VD keys allow the volume level to be increased or decreased. ON and OFF keys allow the the television receiver to be turned on and off. Keys for controlling functions other than volume may be provided as desired.

The output conductors of keyboard 10 are coupled to a power and a microprocessor 14 supply circuit 12. When a key of keyboard 10 is depressed, the corresponding logic "0" causes power supply circuit 12 to apply supply voltage from a battery 16 to the rest of the remote control transmitter, including microprocessor 14. Microprocessor 14 responds to the logic "0" corresponding to the depressed key by generating a digital word in parallel bit format representing an appropriate remote control message as will be explained below. The latter parallel bit digital word is coupled in serial bit format to a modulator 18 which modulates a carrier signal provided by an oscillator 20 in accordance with the received serial digital word. The resulting modulated carrier is amplified by a driver 22 and applied to a transducer 24. Transducer 24, which may comprise either an ultrasonic sound emitting or an infrared light emitting device, transmits the modulated carrier to the remote control receiver of the television receiver shown in FIG. 4.

Power supply circuit 12 includes an "OR" function gate 26. When any one of the keys of keyboard 10 is depressed, the corresponding logic "0" is coupled through "OR" function gate 26 to the set (S) input of a set-reset flip-flop 28 which causes flip-flop 28 to be "set" whereby a high logic level or logic "1" is developed at its Q output. A normally non-conductive electronic switch 30 having a control input coupled to the Q output of flip-flop 28 is rendered conductive in response to logic "1" produced at the Q output of flip-flop 24. As a result, a supply voltage provided by a battery 16 is coupled to a supply voltage input (labeled $V_{cc}$) of microprocessor 14 and to respective supply voltage inputs of modulator 18, carrier oscillator 20 and driver 22. After microprocessor 12 has caused the remote control command corresponding to a depressed key to be generated, it generates a "power off" signal which is coupled to the reset (R) input of flip-flop 28. This causes flip-flop 28 to be "reset" whereby a logic "0" is developed at its Q output. In response, switch 30 is rendered "non-conductive" and the supply voltage from battery 16 is removed from microprocessor 14, modulator 18, oscillator 20 and driver 22. Thus, the transmitter is only energized long enough for the remote control command to be transmitted after a key is depressed. This increases the life time of battery 16.

The output of switch 30 is coupled to a "power up" detector 32 which in turn has an output which is coupled to a "reset" input of microprocessor 14. When a key of keyboard 10 is depressed and switch 30 is, as a result, rendered conductive to couple supply voltage to microprocessor 14, power up detector 30 generates a "reset" pulse. In response to the reset pulse, the control program for microprocessor 14 is initiated as will be described below.

Microprocessor 14 includes input and output (I/O) ports 34 by which information (in digital form) is received from keyboard 10 and coupled to modulator 18 and flip-flop 28. A central processing unit (CPU) 36 controls the transfer and processing of data under the control of a program stored in a read-only memory (ROM) 38. For this purpose CPU 36 addresses ROM 38, reads the instruction stored at the addressed memory location and processes or transfers data according to the instruction. During this operation memory locations of an internal volatile random-access memory (RAM) 40 are used to temporarily store data as it is processed. CPU 36 addressed RAM 40 and transfers information to and from the addressed memory location of RAM 40.

A volatile RAM 42, located externally to microprocessor 14, is used to store a list of preferred and non-preferred channels, i.e., a "skip list", and other data to be discussed with reference to FIG. 2a. The skip list portion of RAM 42 contains a memory location for each channel that can be received. Each memory location contains data, e.g., either a logic "0" or logic "1", indicating whether the corresponding channel is preferred or not preferred, respectively. CPU 36 addresses RAM 42 and transfers data to and from the addressed memory location. To conserve connection terminals ("pins"), the addresses and data are serially transferred between microprocessor 14 and external RAM 42. When a user depresses either the SU key or the SD key, the skip list portion of RAM 42 is sequentially addressed in channel number order until a memory location containing a logic "1" indicating a preferred channel is reached. At that time, the channel number corresponding to the addressed memory location is transmitted to the receiver where the corresponding channel is tuned. To enter data indicating a preferred channel in the skip list portion of RAM 42 a user enters the channel number of the preferred channel by means of the digit keys of keyboard 10. This causes a corresponding memory location of RAM 42 to be addressed. Thereafter the user may either depress the ADD key to indicate that the selected channel is preferred or depress the DEL key to indicate that the selected channel is not preferred (i.e., to be skipped or passed over in a scanning type channel selection).

Battery 16 is directly connected to the supply voltage input ($V_{cc}$) of RAM 42 rather than through switch 30 so that the contents of RAM 42 are maintained when the remote control transmitter is off, i.e., when none of its keys are depressed. While an internal RAM such as 40 of microprocessor 14 may be used to store the skip list, it is more desirable that an external RAM be employed to store the skip list so that battery 16 can be disconnected from microprocessor 14 when the transmitter is not in use.

The COP 420 microprocessor available from National Semiconductor Corp., Santa Clara, Calif., is a suitable choice for microprocessor 14 and the COP 499 RAM, also available from National Semiconductor Corp., is a suitable choice for RAM 42. The COP 420 microprocessor is constructed with CMOS (complementary metal-oxide semiconductor) devices and therefore is particularly well suited since CMOS devices use relatively small amounts of energy.

FIG. 2a shows the data format of the information stored in external data RAM 42. As earlier noted, the skip list portion of RAM 42 includes a memory location for each of the channels which may be received by the television receiver. Assuming that the television receiver is arranged to receive the 82 broadcast channels available in the United States, the skip list portion of RAM 42, symbolically identified as SLR (for "skip list remote") will include 82 memory locations each having an address corresponding to one of the 82 broadcast channels. The memory locations are arranged so that they can be addressed sequentially in channel number order. Since in the present example, a logic "1" is used to indicate a preferred channel and a logic "0" is used to indicate a non-preferred channel, each memory location of the SLR need only store a single bit.

In addition to the skip list portion, RAM 42 includes a memory location in which the channel number of the channel last selected by means of the remote control transmitter is stored for future reference. The contents of this memory location is symbolically identified as CNR (for "channel number remote"). In this example, since the channel number of a selected channel is encoded in BCD (binary coded decimal) format, the digital word CNR has a four bit tens digit portion (NRT) and a four bit units digit portion (CNU).

Finally, external RAM 42 includes a memory location for an eight bit word PLCER (for "power lost constant external RAM"). This word is used in the control program to determine if the contents of RAM 42 have been lost due to the loss of the supply voltage from battery 16 (e.g., when the battery is replaced).

Figure 2C:
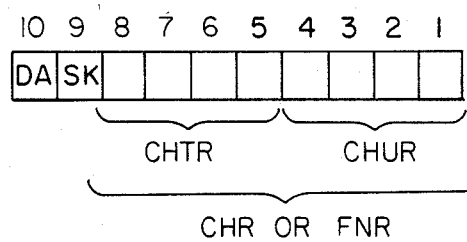

The data format of internal RAM 40 is shown in FIG. 2c. RAM 40 includes a memory location for storing a word KEYR (for "key remote") representing the key of keyboard 10 last depressed by a user. RAM 40 also includes a memory location for storing a one bit word DA (for "direct access") which is set to a logic "1" when a channel is directly selected by means of the digit keys or when a function, such as volume, is controlled. Another memory location stores a one bit word SK (for "scan entry") which is set to a logic "1" when a channel is selected by the scanning operation initiated by depressing either of the SU or SD keys or when a function, such as volume, is controlled.

An eight bit word identified as CHR (for "channel remote") representing in BCD format the channel number which is transmitted by the remote control transmitter at the end of a channel selection operation is stored in another memory location of internal RAM 40. The digital word is partitioned into a tens digit portion CHTR and a units digit portion CHUR.

Finally, a memory location of RAM 40 is provided for storing an eight bit word FNR (for "function") representing the particular function other than channel selection, such as volume or on-off selection, being controlled. While only ON, OFF, VU and VD keys are shown in FIG. 1, it will be appreciated that since FNR includes eight bits, a total of 256 functions in addition to channel selection may be controlled. While RAM 40 is shown as having a memory location for each of the words CHR and FNR for purposes of explanation, it will be appreciated that a single memory location may be used to store both since only one of a channel selection or a function control command is transmitted at a time.

FIG. 2c illustrates the format of the data transmitted by the remote control transmitter. The transmitted word includes ten bits. The tenth bit is the DA bit and the ninth bit is the SK bit. When a channel has been selected, the eighth through fifth bits and the fourth through first bits contain the data words CHTR and CHUR representing the tens and units digits of the selected channel. When a function other than channel selection is controlled, the eighth through first bits contain the digital word FNR representing the controlled function.

Figure 3A:
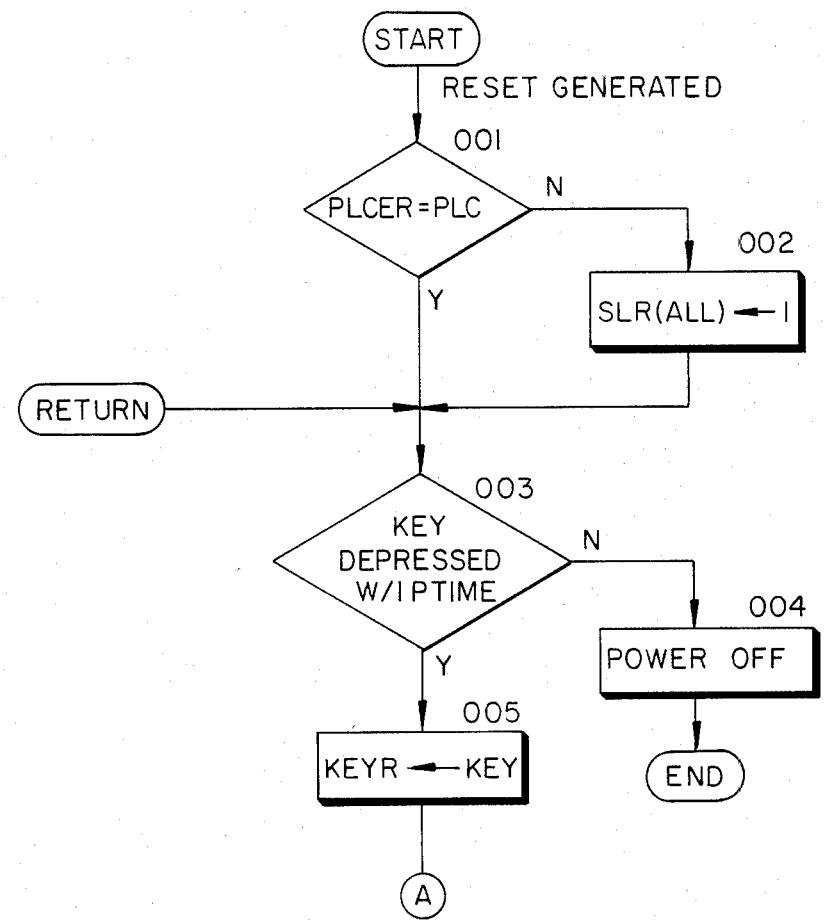
FIGS. 3a, 3b, 3c, 3d, 3e, 3f and 3g show various portions of a flowchart of the control program for the microprocessor of the remote control transmitter shown in FIG. 1.

Turning now to FIG. 3a, the control program starts in response to the generation of a "reset" signal by power up detector 32 when a key is pressed and battery supply voltage is initially applied to microprocessor 14, modulator 18, oscillator 20 and driver 22 is through switch 30. In response to the reset signal, CPU 36 causes the memory location of program ROM 38 which corresponds to the start of the control program to be addressed. At this point in the program (decision diamond 001) the power loss constant word PLCER stored in external RAM 42 is compared to the correct power loss constant word PC generated under program control. If the two words are identical, it indicates that power has not been removed from external data RAM 42 and therefore that the remote skip list has not been lost. However, if the power loss constant words are not identical, it indicates that power has been removed from external RAM 42 and therefore that the remote skip list stored has been lost. In the latter case, each bit of the remote skip list (SLR) is automatically set equal to a logic "1" to indicate that each of the 82 channels is preferred (function block 002) so that the channels may be sequentially selected by either an upward or downward scanning operation for the purpose of programming the skip list as will be explained with reference to FIGS. 3f and 3g. The latter is accomplished by sequentially addressing each memory location of the SLR and at each addressed memory location entering a logic "1".

Assuming now that the remote skip list has not been lost, the output conductors of keyboard 10 are examined to determine if any key has been depressed within a predetermined time delay, e.g., 30 milliseconds, (diamond 003). The latter is accomplished by setting a counter (not shown) included within microprocessor 14 to the predetermined time delay and thereafter examining the output conductors of keyboard 10 to determine if a key has been depressed as long as the counter has not reached a count of zero. If key has not been depressed by the end of the predetermined time delay (diamond 003), CPU 36 causes a power off signal to be coupled to the reset input of flip-flop 28 through the input/output ports (I/O) 34 (block 004). This causes flip-flop 28 to be reset, switch 30 to be rendered nonconductive and the supply voltage to be decoupled from microprocessor 14 and circuits 18 through 22. This places the transmitter in the standby mode. The program ends at this point.

Figure 3B:
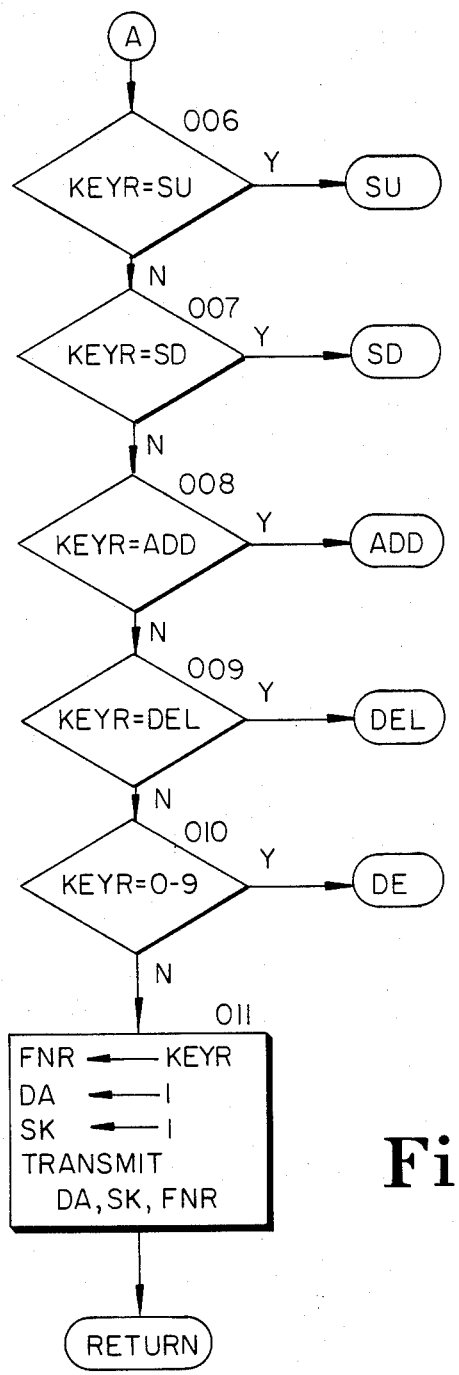

If a key has been depressed within the predetermined time delay (diamond 003) the word representing the specific key that was depressed is stored in the KEYR memory location of internal RAM 40 (block 005). Thereafter, FIG. 3b, the word KEYR is examined to determine specifically which key of keyboard 10 has been depressed (diamonds 006–010). If one of the SU, SD, ADD or DEL keys has been depressed, a correspondingly identified program subroutine, shown in respective FIGS. 3c, 3d, 3f and 3g, is initiated. If any of the digit keys has been depressed, a subroutine DE shown in FIG. 3e is initiated.

If the depressed key corresponds to a function other than channel selection, i.e., the depressed key was not one of the SU, SD, ADD or DEL keys or a digit key, the word KEYR is loaded into the memory location for the word FNR, the bits DA and SK are each set to a logic "1" and, thereafter, bits DA and SK and word FNR are serially transferred in order named to modulator 18 through I/O 34 to transmit the remote control command (block 011). As will be explained below, the purpose of setting DA and SK each to logic "1" is to indicate to the remote control receiver structure shown in FIG. 4 that a function other than channel selection is to be controlled. After the transmission of the remote control command the program returns to decision diamond 003 (FIG. 3a) to await the next keyboard entry. If there is none, the transmitter is placed in the standby mode.

Figure 3C:
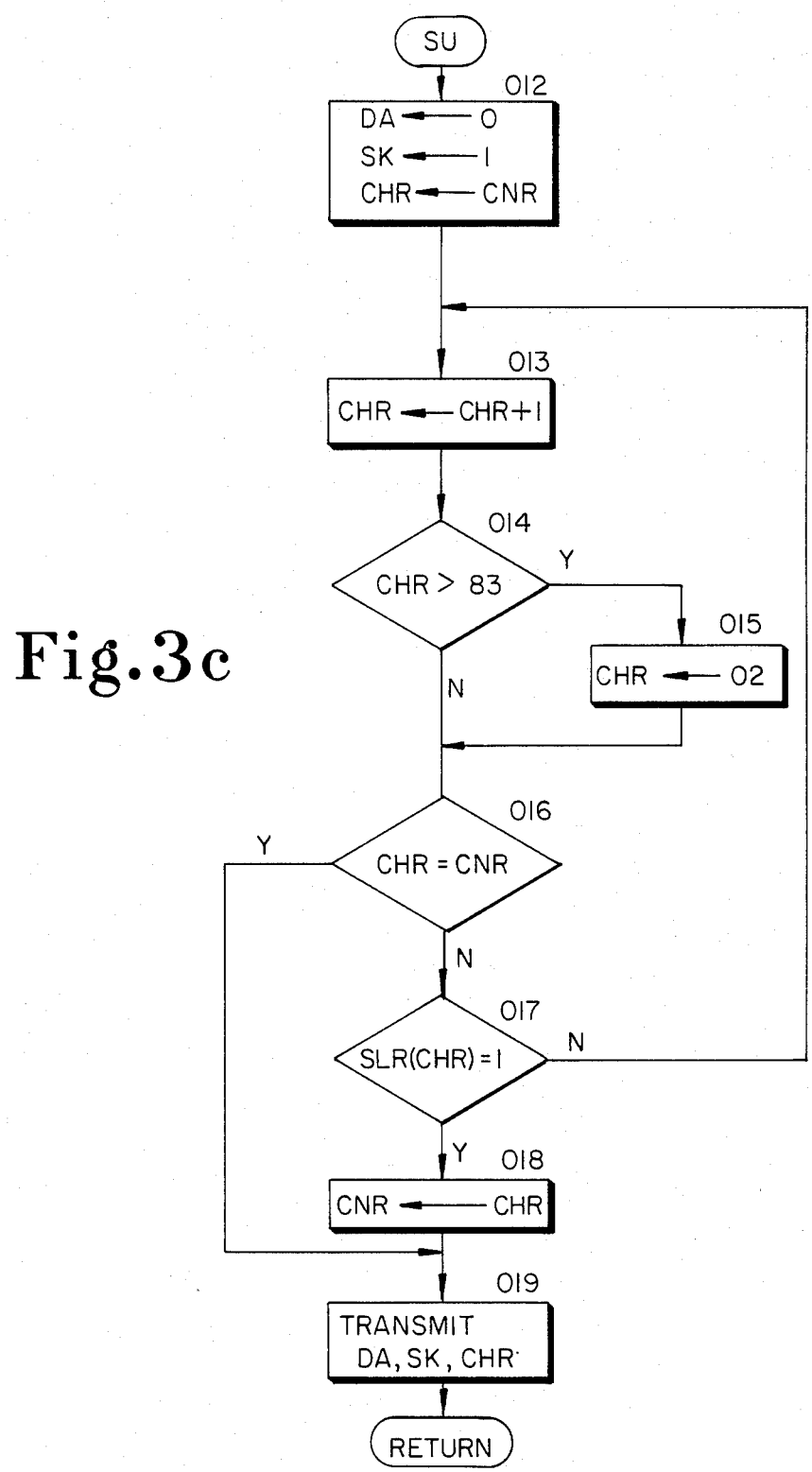
Figure 3D:
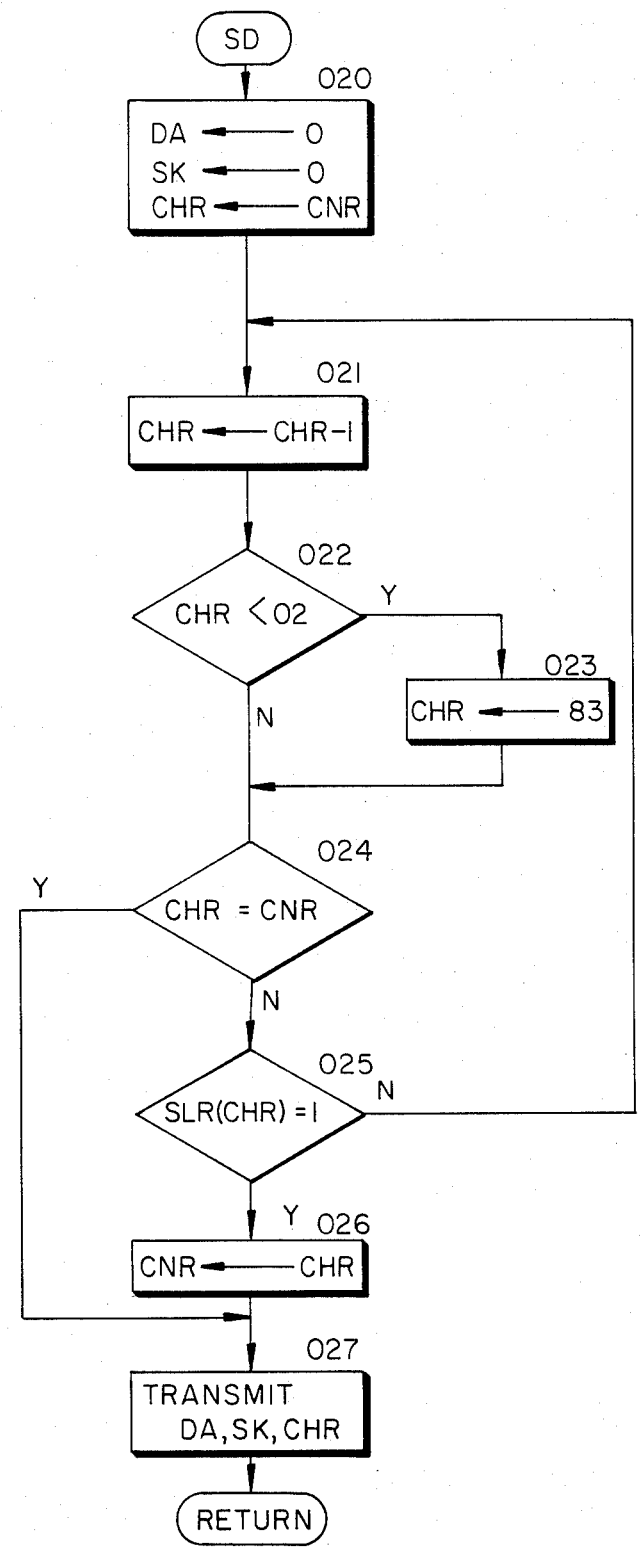
Figure 3E:
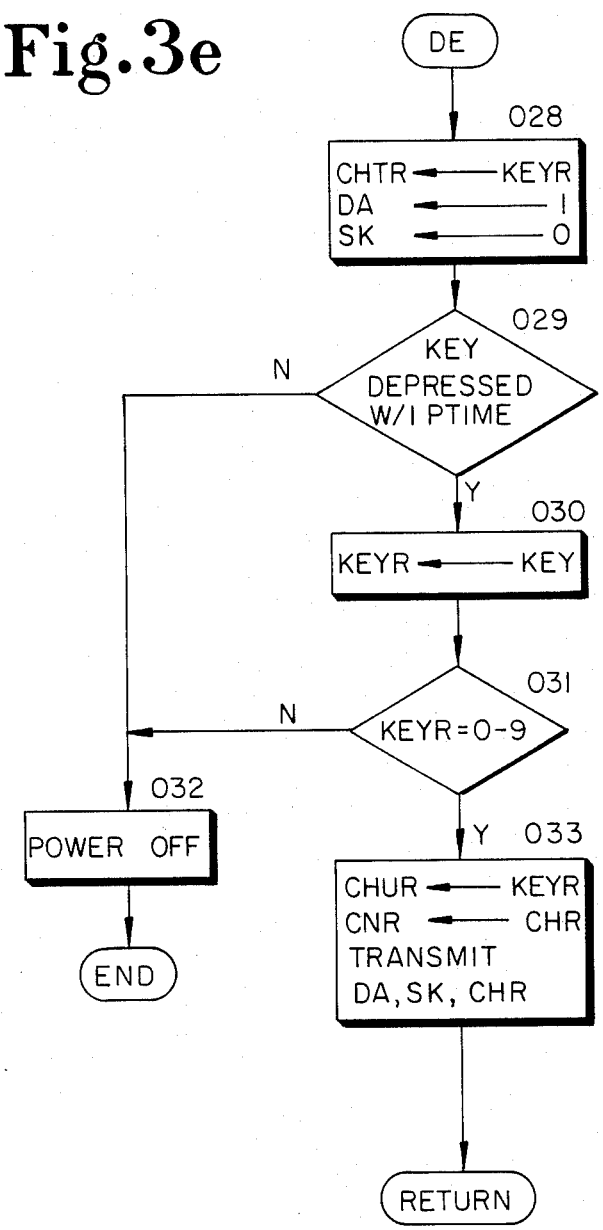

The SU subroutine shown in FIG. 3c causes the skip list to be examined in consecutively increasing channel number order from the channel number of the last channel selected, represented by the word CNR stored in external RAM 42, to find the next preferred channel At the beginning of the SU subroutine bit DA is set to a logic "0" and bit SK is set to a logic "1" (block 012). This signifies that a scanning channel selection operation has been initiated and that the scanning direction is in the increasing channel number or "upward" sense. In addition, the word CHR is set equal to the word CNR representing the channel number of the last channel (block 012) selected. Thereafter, the channel number represented by CHR is increased by one (block 013). Next an examination is made to see if the present channel number represented by CHR is greater than 83, i.e., the highest channel number in this embodiment (diamond 014). If the present channel number is greater than 83, the word CHR is caused to represent channel 02, i.e., the lowest channel number in this embodiment (block 015). This is done because if the highest number channel number has been reached the upward scanning operation should continue from the lowest channel number.

If the present channel number is not greater than 83 (diamond 014) or has been set to 02 (block 015), an examination is made to determine if the present channel number represented by CHR is equal to the channel number of the last channel selected represented by CNR (diamond 016). If CHR and CNR are equal (diamond 016), it indicates that entire remote skip list has been searched from the channel number of the last channel selected without finding a preferred channel. In that case the remote skip list is empty and the present channel number represented by CHR is transmitted (block 019). If CHR and CNR are not equal (diamond 016) the memory location of the remote skip list portion of RAM 42 corresponding to the present channel number (indicated by SLR (CHR)) is examined to determine if it contains a logic "1" (diamond 017) If this is true, it indicates that CHR represents the channel number of a preferred channel. In that case CHR is stored in the memory location of RAM 42 for future reference (block 018) and DA, SK and CHR are transmitted in sequence (block 019). Thereafter, the program returns to await the next depression of a key and if there is none places the transmitter in the standby mode. If the memory location for the present channel number does not contain a logic "1" (diamond 017), the program repeats (from block 013) at successively higher channel numbers until a memory location of the skip list containing a logic "1" is located or until the entire skip list has been searched.

The SD subroutine for the downward scanning operation shown in FIG. 3b is similar to the SU subroutine shown in FIG. 3c except that the direction of scanning is downward. Accordingly, portions 020, 021, 022, 023, 024, 025, 026 and 027 of the SD subroutine correspond in function to portions 012, 013, 014, 015, 016, 017, 018 and 019 of the SU subroutine. As in the SU subroutine when a channel corresponding to a preferred channel is located in the skip list, the channel number represented by CHR together with the appropriate SK and DA data bits are transmitted. Since the type of channel selection operation is a scanning operation, the DA bit is set to a logic "0" and since the scanning direction is downward the SK bit is also set to a logic "0".

The DE subroutine is to form the complete two digit channel number when a user makes a direct channel selection. After a digit key is depressed, the word CHTR representing the tens digit of the channel to be selected is set equal to the word KEYR, the DA bit is set to a logic "1", indicating a direct entry, and the SK bit is set to a logic "0" (block 028). Thereafter an examination is made to determine if a second digit key has been depressed with a predetermined time delay as (diamond 028, block 030 and diamond 031). If a second digit key has not been depressed within the predetermined time delay CPU 36 causes a power off signal to be generated to place the transmitter in the standby mode and the program ends. This prevents a partial direct channel selection entry from being transmitted. However, if a second digit key has been depressed within the predetermined time delay, the word KEYR is entered into the memory location of RAM 40 for the word CHUR, which represents the units digit of the selected channel, the word CHR is stored in the memory location for CNR and DA, SK and CHR are transmitted in the order named (033) After this the program returns to await for the next keyboard entry and if there is none causes the transmitter to be placed in the standby mode.

Figure 3F:
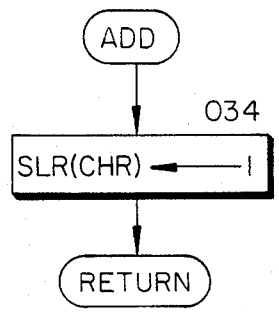
Figure 3G:
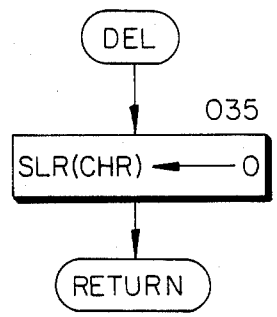

The subroutine for the entry of a preferred channel in the skip list portion of RAM 42 is shown in FIG. 3f. After the channel number of the channel to be entered into the skip list is selected either by direct entry selection or by an upward or downward scanning operation the ADD key is depressed causing a logic "1" loaded into the skip list memory location corresponding to the channel number of the selected channel (block 034). Thereafter, the program returns to await for the next keyboard entry. The subroutine for indicating a non-preferred channel in the skip list is shown in FIG. 3g. This subroutine is similar to that of the ADD subroutine shown in FIG. 3f except, of course, that the memory location of the skip list in RAM 42 corresponding to the non-preferred channel is loaded with a logic "0" rather than a logic "1" (block 034).

Reference is now made to FIG. 4 in which a television receiver including a remote control receiver section controlled by a microprocessor to automatically learn the remote skip list stored in RAM 42 of the remote control transmitter shown in FIG. 1 is shown. The receiver includes an RF input represented by an antenna 44, a tuner 46 and a signal processing section 48 arranged in conventional fashion to produce video and audio signals from RF television signals received by antenna 44. Tuner 46 and signal processing section 48 receive supply voltages from a main power supply 50 which derives these supply voltages from the AC line voltage An electronic switch 52 is coupled to main power supply 50 by which power may be selectively supplied and removed from tuner 46 and signal processing section 48 to thereby turn the receiver on and off.

The remote receiver section of the receiver receives remote control signals transmitted from the remote control transmitter shown in FIG. 1 and derives from them control signals for controlling tuner 46 and signal processing section 48. The remote control receiver section receives supply voltages from a standby power supply 54. Standby power supply 54 is directly connected to the AC line so that power is supplied to the remote control section of the receiver even when the tuner 46 and signal processing section 48 are off so that a remote control signal for turning the receiver on can be processed.

The remote control section includes a transducer 56 which converts the signal emitted by transducer 24 of remote control transmitter shown in FIG. 1 to a corresponding electrical signal. Transducer 54 is followed in succession by an amplifier 58 and a demodulator 60. Demodulator 60 removes the transmission carrier from the amplified electrical signal to produce, in serial format, a digital word representing the transmitted remote control command. The serial word coupled to a microprocessor 62 which under control of a program generates control signals for tuner 46, signal processing section 48 and on/off switch 52. Microprocessor 62 includes an I/O port 64, a CPU 66, a program ROM 68 and an internal RAM 70 which cooperate and function in the same manner as the corresponding parts of microprocessor 14 of the remote control transmitter shown in FIG. 1.

A keyboard 72 by which a user may control the television receiver locally (i.e., at the receiver) has output conductors coupled to the I/O port 64 of microprocessor 62. To provide the same control features that are provided by means of the remote control transmitter shown in FIG. 1, the keys of keyboard 72 are the same as those on keyboard 10 of the transmitter except that ADD and DEL keys are not present. The ADD and DEL keys are not needed on keyboard 72 since, as will be described below, a skip list associated with local channel selection is automatically learned or programmed from the remote skip list stored in external RAM 42 of the transmitter and therefore need not be programmed by the user.

The local skip list is stored in internal RAM 70 of microprocessor 62. Since power is maintained to microprocessor 62 even when the receiver is off so that it can process received remote control signals, the local skip list stored in internal RAM 70 is also maintained when the receiver is off. In addition the use of internal RAM 70 avoids the need of an additional integrated circuit and the associated connections. The COP 444L microprocessor available from National Semiconductor Corp., is suitable for use as microprocessor 62.

It will be noted that if power is removed from the remote control receiver section of the television receiver, e.g., when the receiver is disconnected ("unplugged") from the AC line or when the AC line exhibits a temporary voltage dropout, the information stored in RAM 70 including the local skip list will be lost. However, due to the automatic learning or programming feature referred to above, there is no need for the local skip list to be reprogrammed by a user.

A power up detector 74, is responsive to the supply voltage for microprocessor 62 generated by standby power supply 52 to determine when power is reestablished after a loss of AC line voltage. In response to this occurrence power up detector 74 generates a "reset" signal which is coupled to a reset input of microprocessor 62. The reset signal causes the control program to be initiated as will be described below.

In accordance with the type of remote control message or the specific key of keyboard 72 which is depressed, control commands are generated by microprocessor 62 for controlling on/off switch 52 and thereby the on and off states of the television receiver, the channel selected by tuner 46 and certain functions of signal processing section 48 such as the volume level.

For the purpose of controlling the on and off states of the television receiver a flip-flop 76 receives set (S) and reset (R) control signals from microprocessor 62 and provides a control signal to on/off switch 52. When flip-flop 76 is set, switch 52 is rendered conductive to turn the main portion of the receiver on and when flip-flop 76 is reset, switch 52 is rendered nonconductive to turn the main portion of the receiver off.

For the purpose of selecting channels, a digital word representing the channel number of the selected channel is coupled, in parallel bit format, to a channel number register 78. In response to the channel number stored in channel number register 78, tuner 46 tunes RF signal corresponding to the selected channel. The channel number of the selected channel is displayed by a two digit display unit 80.

For the purpose of controlling audio volume, microprocessor 62 generates a digital word representing the volume level which is coupled to a volume register 82. The contents of volume register 80 are coupled to signal processing section 48 to control the volume level.

The supply voltages for flip-flop 76 channel number register 78 and volume register 82 are provided by standby power supply 54 so that respective their contents are maintained when the main portion of the receiver is off. Because the contents of channel number register 78 and volume register 82 are maintained after the receiver is turned off, when the receiver is again turned on the previously selected channel is again tuned and the previously established volume level is again established.

The manner by which the remote control receiver learns the skip list stored in the remote control transmitter will be described with reference to the program flowchart shown in FIGS. 6a through 6d. The format of the data stored in internal RAM 70 and processed by CPU 66 according to the program is indicated in FIG. 5.

The skip list portion SLL ("skip list local") of RAM 66 is arranged in the same format as the skip list portion in external RAM 42 of the remote control transmitter and includes 82 single bit memory locations which are addressed by the respective channel numbers. A memory local is provided for storing a word CNL representing in BCD format the channel number of the channel last selected. The word CNL is partitioned into a tens portion (CNLT) and a units portion (CNLU). A memory location is also provided for storing a word KEYL representing the last key of local keyboard 72 depressed by a user. Since keyboard 72 has 15 keys in this example, KEYL has four bits. In addition, an eight-bit memory location is provided for storing a word CHL processed by microprocessor 62 to develop the word CNL. The word CHL has two four-bit BCD portions CHLT and CHLU representing the tens and units digits of the channel number. An eight-bit memory location is also provided for storing a word FNL representing the function selected under the control of microprocessor 62.

Two one-bit memory locations are provided for storing the DA and SK bits of the remote control message received from the transmitter. Two eight-bit memory locations are provided for storing the CHR and FNR words of the transmitted message. Finally, a memory location is provided for storing a one-bit word LAST indicating whether the last channel selection command was entered by means of local keyboard 72 or by means of remote keyboard I/O. If the last channel selection command was entered by means of local keyboard 72, LAST will be a logic "1" and if the command was entered by means of the remote keyboard 10, LAST will be set to a logic "0".

Figure 6A:
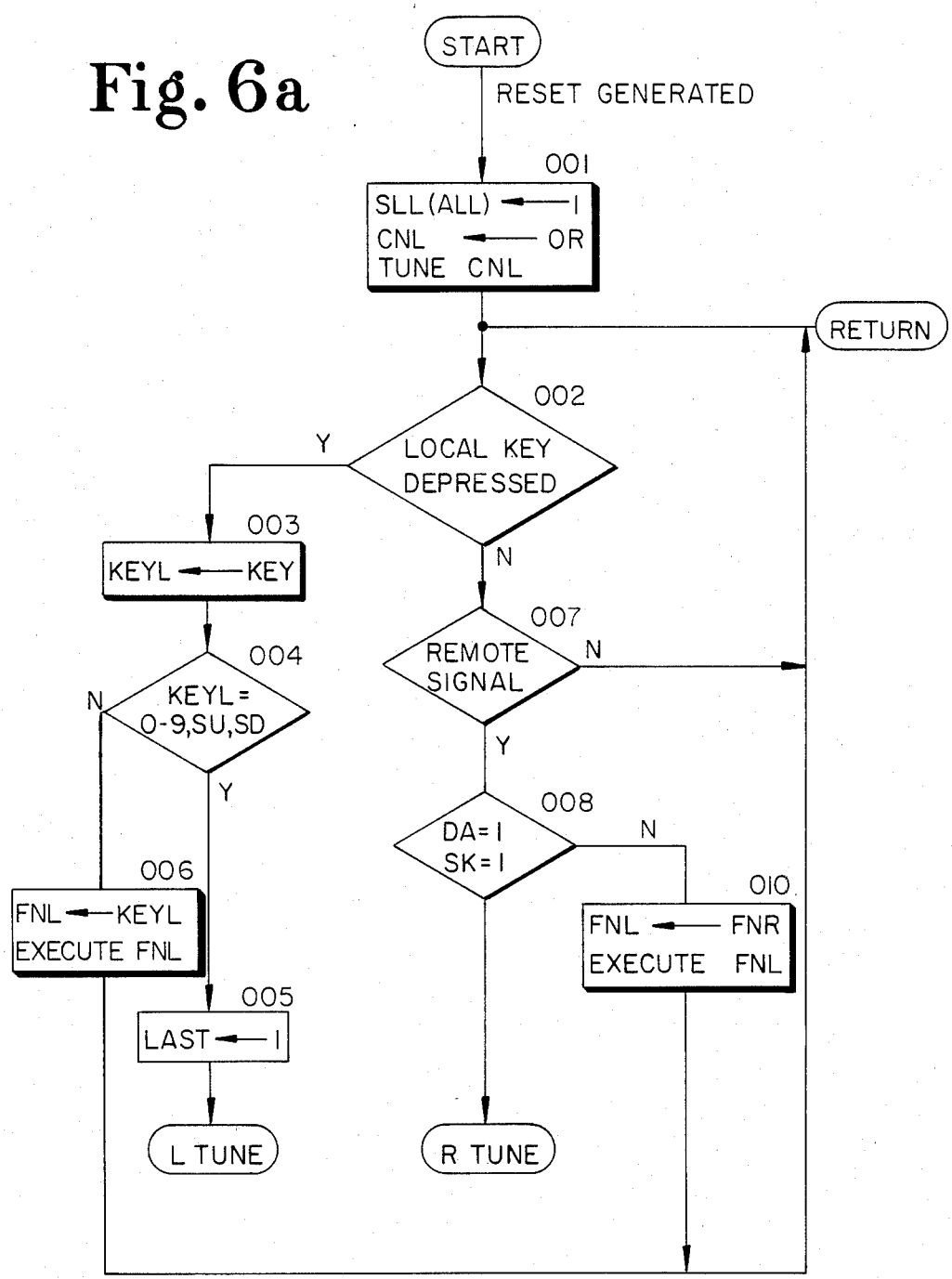
FIGS. 6a, 6b and 6c show various portions of a flowchart of the control program for the microprocessor of the remote control receiver shown in FIG. 4.

Now, turning to FIG. 6a, the control program for microprocessor 62 is initiated in response to the generation of the reset signal by power up detector 74 when the receiver is first connected to the AC line (i.e., "plugged in") or when the AC line voltage returns to its normal amplitude after a temporary power loss. Specifically, the reset signal causes CPU 66 to address the memory location of program ROM 68 corresponding to the start of the program. After the reset signal is generated, each memory location of the local skip list (SLL) of RAM 70 is set to contain a logic "1" (block 001). This causes each channel to be identified as a preferred channel so that a user may select each one of the channels by using the SU and SD keys of local keyboard 72. The local skip list remains in this condition until it learns the remote list stored in RAM 42 of remote control transmitter. In addition, the word CNL is set to represent the lowest channel number, i.e., 02 in this embodiment, and transferred to channel number register 78 through I/O 64 so that channel 02 is tuned (block 001). Thereafter, the program waits for either the depression of a key of local keyboard 72 or the reception of a remote control message.

An examination is made to see if a local key is depressed by means of examining the output conductors of keyboard 72 (diamond 002). If a local key has been depressed, the corresponding word key will be stored in the KEYL memory location of RAM 70 (block 003). Thereafter, the type of key depressed is determined (diamond 004). If the depressed key was a digit key or either one of the SU or SD keys, i.e., represents a channel selection command, the word LAST is set to a logic "1" (block 005) and thereafter a subroutine identified as LTUNE (for "local tuning") is initiated.

If a depressed key was not a channel selection key but rather a function control key (diamond 004), the word KEYL is loaded into the memory location for the word FNL and the function is caused to be executed (block 006). To accomplish the latter, CPU 66 causes the word FNL, representing the function to be controlled, to be coupled through I/O 64 to the appropriate function register such as or on-off flip-flop 76 or volume register 82. Thereafter, the program returns to decision diamond 002 to determine if another local key has been depressed.

If a local key has not been depressed (diamond 002), an examination is made to determine if a remote control signal is being received (diamond 007). This is accomplished by examining whether or not a remote control data word is being received from demodulator 60 through I/O port 64. If no remote data word is being received, the program returns to decision diamond 002 to determine if a local key has been depressed. Although not shown in the flowchart, it will be appreciated that while waiting for a local key to be depressed or for a remote control data word to be received, other television functions may be performed by microprocessor 62. For example, microprocessor 62 may be used to control channel number display 80.

Figure 6B:
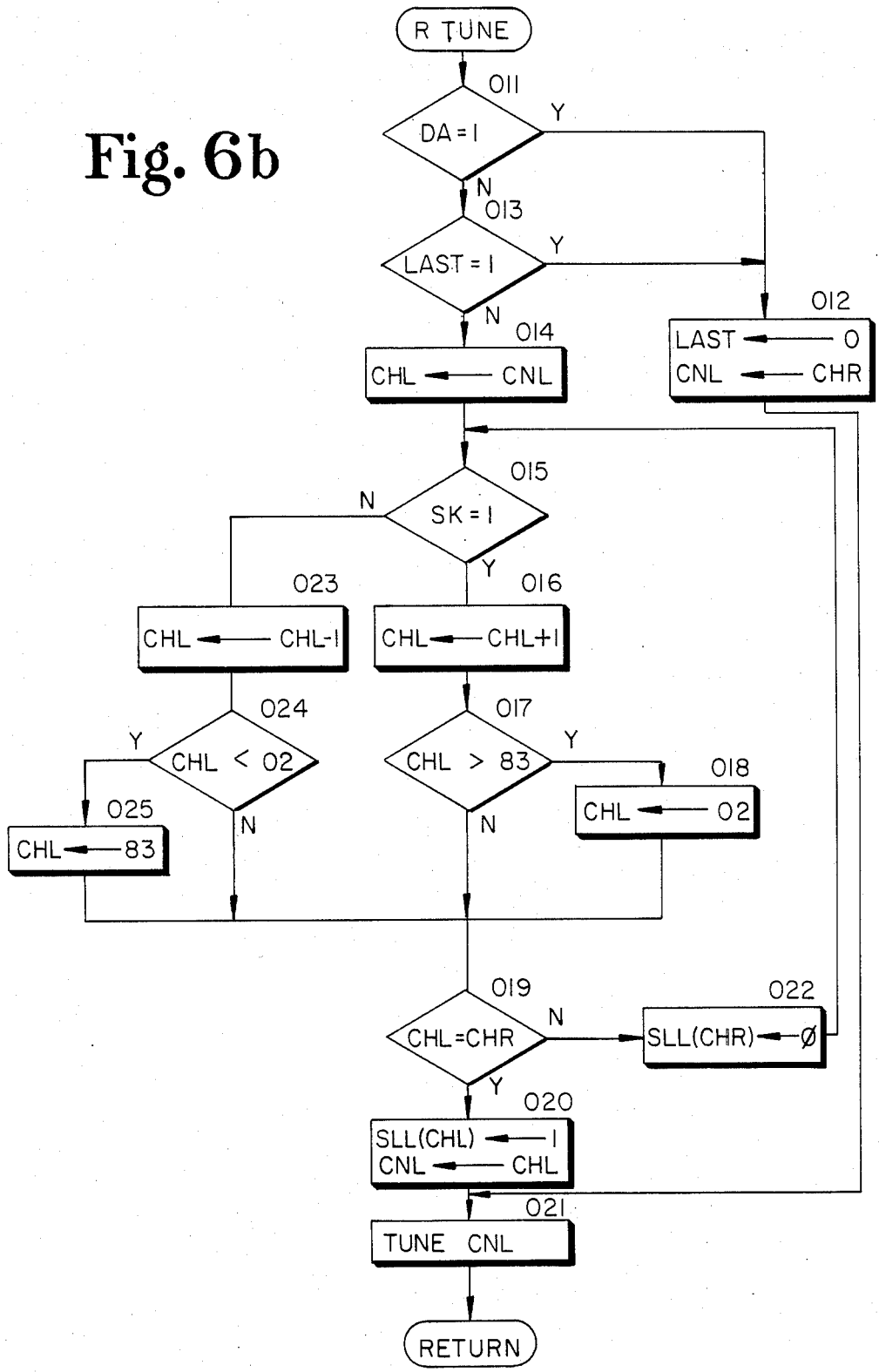

If a remote control data word has been received (diamond 007), an examination is made to determine if it represents a channel selection command or whether it represents another function control command (diamond 008). As earlier noted, function control commands other than channel selection commands are indicated by the DA and SK data bits both being set to a logic "1". If both DA and SK have not been set to a logic "1" (diamond 008), indicating that the remote control message is a channel selection command, a routine identified as RTUNE (for "remote tuning") shown in FIG. 6b is initiated. However, if both DA and SK data bits have been set to a logic "1" (diamond 008), indicating that the remote control message is a function control command other than channel selection, the FNR word portion of the transmitted data word representing the function to be controlled, is transferred to the memory location for storing the data word FNL and the function represented by FNL is executed by transferring an appropriate control command to the respective control unit, such as flip-flop 76 or volume register 82 (block 010). Thereafter, the program returns to decision diamond 002 to wait for the depression of a local key or the reception of another remote control message.

FIG. 6b indicates the RTUNE subroutine by which the local skip list (SLL) stored in RAM 70 of the remote control receiver section of the television receiver is automatically programmed by being caused to learn the remote skip list stored in the RAM 42 of the remote control transmitter. The first step in the RTUNE subroutine is to determine whether a direct channel selection entry has been made by means of keyboard 10 of the remote control transmitter by determining whether the DA bit of the transmitted remote control data word to is a logic "1" (diamond 001). If DA is a logic "1", the CHR portion of the transmitted data word, representing the transmitted channel number channel is stored in the memory location or RAM 70 corresponding to the data word CNL (block 012). Thereafter, the channel corresponding to the channel number represented by CNL is caused to be tuned (block 021). After this the program returns to decision diamond 002 shown in FIG. 6a to wait for the next entry.

If DA is not a logic "1" (diamond 011), indicating that the remote control data word represents a scan type channel selection command, an examination is made to determine whether or not the last channel selection command was entered locally, i.e., entered by means of keyboard 72, by determining whether or not the LAST bit is a logic "1" (diamond 013). If the last channel selection command was locally entered, the automatic programming routine is not initiated but rather the remotely selected channel is simply tuned. The purpose of this, as will be later explained in detail, is to avoid the entrance of erroneous information in the local skip list. Thus, if the LAST bit is set to a logic "1", the word LAST is set to a logic "0" to provide an indication in the next remote control channel selection operation that the last channel selection entry was made remotely (block 012), the word CHR portion of the transmitted data word representing the transmitted channel number is stored in the memory location of RAM 70 for CHL (block 012) and the corresponding channel is tuned (block 021).

If the last channel selection command was not a locally entered one, indicated by the LAST bit being a logic "0" (diamond 013), the automatic programming routine is started. First, the contents of the CNL memory location to the CHL memory location (block 014) so that the automatic programming routine starts with the channel number of the last channel selected. Then, the direction of scan is determined by examining the SK bit of transmitted remote control data word (diamond 013). If SK bit is a logic "1", it indicates that the direction of scan is upward. If the bit SK is a logic "0", it indicates that the direction of scan transmitted is downward.

Assuming the direction of scan to be upward, the channel number represented by CHL is increased by 1 (block 016). Thereafter, an examination is made to determine whether the highest channel number, e.g., 83, has been exceeded (diamond 017). If channel number 83 has been exceeded, the word CHL is caused to represent the lowest channel number, e.g., 02, (block 018) so that the operation continues in the range of legitimate channel numbers between 02 and 83. Whether or not the highest channel number has been reached, an examination is made to determine whether the presently generated channel number represented by CHL equals the transmitted channel number represented by CHR (diamond 018). If a match exists (diamond 019), it indicates that the address of a memory location of the local skip list (SLL) of RAM 70 has been reached which corresponds to a preferred channel since the address corresponds to preferred channel number transmitted from the remote transmitter in response to a scan type channel selection. In this case, the skip list memory location corresponding to the presently generated channel number represented by CHL (indicated by SLL (CHL)) is loaded with a logic "1", CHL is stored in the memory location for CNL for future reference and the channel represented by CNL is tuned (block 020 and 021). Thereafter the program returns to await the next entry.

If the presently generated channel number represented by CHL does not correspond to the transmitted channel number represented by CHR (diamond 019), it indicates that the presently selected channel is not preferred, and the skip list portion memory location of RAM 70 corresponding to CHL is loaded with a logic "0" (block 022. Thereafter, the routine looking for a match between CHL and CHR is performed for the next higher channel number starting block 015.

If the scan direction is downward indicated by SK not being a logic "1" (diamond 015), the routine is essentially the same as for the upward scanning direction. That is, sequentially lower channel numbers are generated until a match between the locally generated channel number represented by CHL and remotely transmitted channel number represented by CHR occurs. Until a match occurs, for each locally generated channel number represented by CHL, a logic "0" is entered into the corresponding memory location of RAM 70. When a match occurs, a logic "1" is entered into the memory location of RAM 70 corresponding to the locally generated channel number represented by CHL. Blocks 23, 24 and 25 are concerned with the downward scanning operation and correspond in function to blocks 016, 017 and 018 of the upward scan operation.

As earlier noted, when a remote control signal is received which corresponds to a channel selection command, an examination is made to determine whether the last channel selection command was locally or remotely generated as is indicated by decision diamond 013. The purpose of this is to ensure that the automatic programming operation for the local skip list starts with the last channel selected by using the remote control transmitter. If this is not done, the local skip list may not match remote skip list. This will be explained by way of example. It is assumed for this example that the skip list stored in the transmitter contains a preferred indication for channels 2 through 13 (i.e., all the VHF channels) in the United States. Further, it is assumed that the last remotely selected channel was channel 05 and that thereafter channel 03 is locally selected. When the next remote SU channel selection command is transmitted, the transmitted channel number is channel 06 (since the scan operation starts with channel 05 and all the VHF channels are indicated as being preferred in the remote skip list). If the examination to determine whether the last channel selection is remotely or locally generated is not made, the automatic programming operation for the local skip list will start from channel 03 rather than from channel 05 due to the intervening local selection of channel 3. Since no match between the transmitted channel number and the locally generated channel number will occur until channel number 06, a non-preferred channel indication will be entered in the local skip list for the memory locations corresponding to channels 04 and 05, although these channels are actually preferred.

Figure 6C:
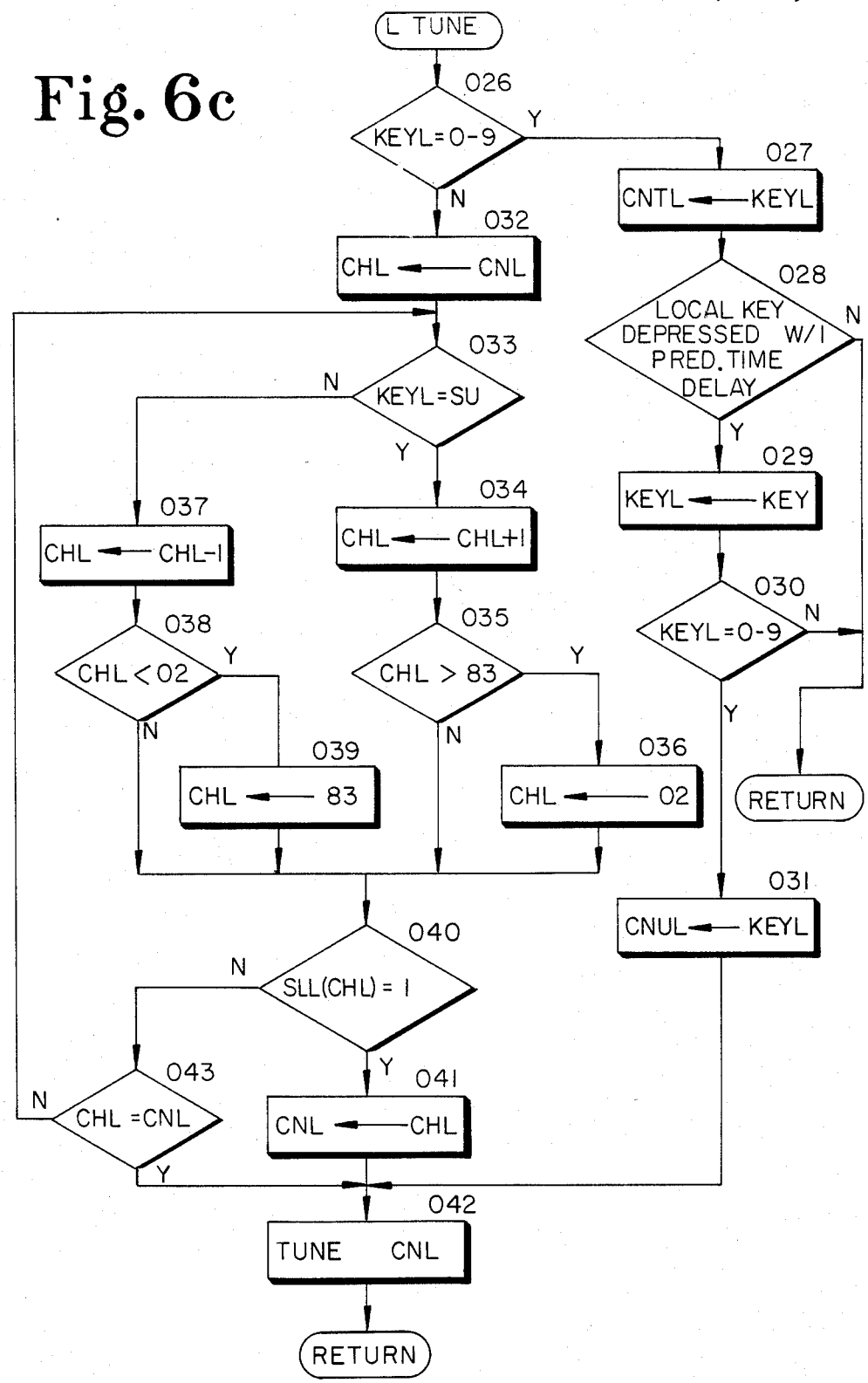

FIG. 6c shows the LTUNE subroutine for the selection of channels by means of local keyboard 72. First a determination is made whether or not the depressed key, the representation of which was previously stored in the memory location of RAM 70 for the word KEYL (block 003 of FIG. 6a), was a digit key (diamond 026). If the depressed key was a digit key, the word KEYL is loaded into the memory location of RAM 70 for the word CNTL representing the tens digit of the channel (block 025). Thereafter, an examination is made to determine if another local digit key is depressed within a predetermined time duration, e.g., 30 seconds (diamond 028, block 029 and diamond 030). If a second local digit key is not depressed, the program returns to decision block 002 (FIG. 6a) to wait for the next local or remote entry. If a second key is depressed, the word KEYL representing the depressed key is loaded into the memory location of internal RAM 70 for the word CNUL representing the units digit of the selected channel number (block 031) and the corresponding channel is tuned (block 042). If the second key depressed is not a digit key, the program returns to decision diamond 002 to wait for another entry.

If the depressed key of local keyboard 72 was not a digit key (diamond 026), the word CHL is set to equal the word CNL, representing the channel number of the last channel selected (block 032). Thereafter, the word KEYL is examined to determine whether the SU or the SD key was depressed (decision diamond 033). Depending on the direction of scan, the channel number represented by CHL is successively increased (block 034, diamond 035 and block 036) or decreased (block 037, diamond 038 and block 039) and at each channel number the respective memory location of the local skip list portion is examined to determine if the corresponding channel is preferred (diamond 40). If a preferred channel is located the corresponding channel, the word CHL is transferred to the memory location of RAM 70 for the word CNL for future reference (block 041) and the corresponding channel is tuned (block 042).

If the local skip list has not been programmed, no preferred channel will be located. To prevent the examination to continue without end, i.e., to prevent the creation of an infinite loop in the program, after the examination of a memory location of the local skip list (diamond 040), the presently selected channel number represented by CHL is compared to the channel number of the last channel selected represented by CNL (diamond 043). If a match exists, it indicates that the entire local skip list is empty and the last selected channel is caused to be tuned (block 043). If a match between CHL and CNL does exist, program returns to decision diamond 031 to continue the search for a preferred channel in the selected scan directed.

With reference to the remote control transmitter shown in FIG. 1, it may be desirable to provide a mode switch coupled to microprocessor 14 by which microprocessor 14 is only enabled to respond to the depression of the ADD and DEL keys when the mode switch is thrown to a program position so that the remote skip list (and therefore also the local skip list) cannot accidently be changed during normal use of the keyboard. To accomplish the same thing, a moveable cover may be placed over the ADD and DEL keys. With reference to the remote control receiver shown in FIG. 4, while on/off flip-flop 76, channel number register 78 and volume register 82 are shown external to microprocessor 72, these registers may be internal to microprocessor 72. Moreover, while the present invention has been described with reference to an implementation using a microprocessor, it will be appreciated that it may also be implemented with discrete logic elements. These and other modifications are intended to be within the scope of the invention defined by the following claims.

What is claimed is:

1. A remote control system of a communications receiver including channel tuning apparatus, comprising:

a remote control transmitter including a remote keyboard having at least one scan key; remote channel number generating means for causing coded signals representing sequential channel numbers to be generated when said scan key of said remote keyboard is activated; a remote memory including memory locations corresponding to respective channels which are addressable in response to said coded channel number representative signals, each of said memory locations storing a coded indication of whether or not the respective channel is preferred for reception; remote memory examining means for examining the contents of addressed ones of said memory locations of said remote memory and causing said remote channel number generating means to stop changing said coded channel number representative signals when an addressed one of said memory locations contains a preferred channel indication; and transmitting means for transmitting in a remote control message the coded channel number representative signals generated by said remote channel number generating means;

a local keyboard mounted on said communications receiver including at least one scan key of the same type as said scan key of said remote keyboard;

a remote control receiver included within said communication receiver including receiving means for receiving a transmitted remote control message; local channel number generating means for causing coded signals representing sequential channel numbers to be generated when said scan key of said local keyboard is activated; a local memory including memory locations corresponding to respective channels which are addressable in response to said coded channel number representative signals generated by said local channel number generating means, each of said memory locations of said local memory storing a coded indication of whether or not the respective channel is preferred for reception; local memory examining means for examining the contents of addressed ones of said memory locations of said local memory and causing said local channel number generating means to stop changing said coded channel number representative signals when an addressed one of said memory locations contains a preferred channel indication; and programming means responsive to said remote control message for automatically programming said local memory with the same preferred and nonpreferred channel information as is contained in said remote memory; and tuning means included within said communications receiver and responsive to the coded channel number representative signals generated by said local channel number generating means to tune the corresponding channel.

2. The remote control system recited in claim 1 wherein:

said programming means is responsive to said remote control message for causing said local channel number generating means to generate said coded channel number representing sequential channel numbers from the coded channel representative signals representing the channel number of the last channel tuned and at each channel number determining whether or not the channel number represented by said coded channel number representative signals generated by said local channel number generating means is equal to the channel number of said coded channel number representative signals of said remote control message; and said programming means at each channel number causes a nonpreferred channel indication to be entered into the addressed memory location of said local memory when no equality exists and causes a coded preferred channel indication to be entered into the addressed memory location of said local memory when an equality exists.

3. The remote control system recited in claim 2 wherein:

said remote keyboard includes an "up" scan key and a "down" scan key;

said remote channel number generating means causes coded channel number representative signals representing sequentially increasing channel numbers to be generated when said "up" scan key of said remote keyboard is activated and causing coded signals representing sequentially decreasing channel numbers to be generated when said "down" scan key of said remote keyboard is activated;

said transmission means is responsive to the activated one of said "up" and "down" scan keys of said remote keyboard to include in said remote control message with said coded channel number representative signals a coded indication of which one of said "up" and "down" scan keys was activated; and said programming means is responsive to said remote control message for causing said local channel number generating means to generate coded channel signals representing sequentially increasing channel numbers when said remote control message contains a coded indication that said "up" scan key of said remote keyboard was activated and to generate coded channel signals representing sequentially decreasing channel numbers when said remote control message contains a coded indication that said "down" scan key of said remote keyboard was activated.

4. The remote control system recited in claim 3 wherein:

said remote keyboard also includes direct channel entry keys;

said remote channel number generating means also generates coded signals representing the channel number of the particular channel entered in response to the activation of said direct channel entry keys;

said transmission means is responsive to the activated one of said scan and direct channel entry keys for including in said remote control message with said coded channel number representative signals a coded indication of whether one of said scan keys or whether one of said direct entry keys was activated;

said local channel number generating means is responsive to said remote control message for generating coded signals representing the same channel number as represented by the coded channel number representative signals of said remote control message when said remote control message includes an indication that one of said direct channel entry keys of said remote keyboard was activated; and said programming means is responsive to said remote control message for causing said local channel number generating means to generate coded signals representing sequential channels only when said remote control message includes a coded indication that one of said scan keys of said remote keyboard was activated.

5. The remote control system recited in claim 4 wherein:

said programming means is responsive to prior activation of one of said keys of said local keyboard before the reception of a remote control message to disable the entry of information into said local memory in response to a received remote control message.

6. The remote control system recited in claim 1 wherein:

said remote control transmitter includes a battery for supplying operating voltage to circuits within said remote control transmitter;

said remote memory is a volatile memory and receives said operating voltage from said battery;

said remote control receiver includes a power supply coupled to an AC line for supplying operating voltage to circuits within said remote control receiver; and said local memory is a volatile memory and receives said operating voltage from said power supply.

7. The remote control system recited in claim 6 wherein:

said remote channel number generating means and said remote memory examining means are included in a first microprocessor and said remote memory is external to said first microprocessor;

switch means are provided for selectively connecting said battery to a supply voltage input of said first microprocessor when a key of said remote keyboard has been activated and disconnecting said battery from said supply voltage input of said first microprocessor of said remote control transmitter after a remote control message has been transmitted;

said local channel number generating means, said local memory examining means and said programming means are included with a second microprocessor and said local memory is internal to said second microprocessor; and coupling means are provided for continuously connecting said power supply to a supply voltage input of said second microprocessor.

* * * * *